United States Patent

Troska et al.

(10) Patent No.: US 11,211,307 B2
(45) Date of Patent: Dec. 28, 2021

(54) SEMICONDUCTOR SUBSTRATE

(71) Applicant: Infineon Technologies AG, Neubiberg (DE)

(72) Inventors: Georg Troska, Warstein (DE); Hans Hartung, Warstein (DE); Marianna Nomann, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 115 days.

(21) Appl. No.: 16/671,541

(22) Filed: Nov. 1, 2019

(65) Prior Publication Data

US 2020/0144154 A1    May 7, 2020

(30) Foreign Application Priority Data

Nov. 2, 2018  (EP) ..................... 18204115

(51) Int. Cl.
    *H01L 23/373*  (2006.01)
    *H01L 23/15*   (2006.01)
    *H01L 25/07*   (2006.01)
    *H01L 23/498*  (2006.01)

(52) U.S. Cl.
    CPC .......... *H01L 23/3735* (2013.01); *H01L 23/15* (2013.01); *H01L 23/3731* (2013.01); *H01L 25/072* (2013.01); *H01L 23/49822* (2013.01)

(58) Field of Classification Search
    None
    See application file for complete search history.

(56) References Cited

U.S. PATENT DOCUMENTS

| | | | |
|---|---|---|---|
| 2002/0084103 A1* | 7/2002 | Komatsu | H01L 23/15 174/255 |
| 2004/0140116 A1* | 7/2004 | Bayerer | H01L 23/295 174/524 |
| 2017/0152192 A1* | 6/2017 | Lin | C04B 35/632 |
| 2018/0002237 A1* | 1/2018 | Aoki | H01L 23/13 |
| 2020/0308072 A1* | 10/2020 | Herbst | H01L 23/3735 |

FOREIGN PATENT DOCUMENTS

| | | |
|---|---|---|
| DE | 4436644 A1 | 4/1996 |
| EP | 3210951 A1 | 8/2017 |
| EP | 3248956 A1 | 11/2017 |
| EP | 3418428 A1 | 12/2018 |
| WO | 03001594 A2 | 1/2003 |
| WO | 2016029762 A1 | 3/2016 |
| WO | 2017142090 A1 | 8/2017 |

* cited by examiner

*Primary Examiner* — Andres Munoz

(74) *Attorney, Agent, or Firm* — Murphy, Bilak & Homiller, PLLC

(57) ABSTRACT

A semiconductor substrate includes a dielectric insulation layer and a first metallization layer attached to the dielectric insulation layer. The dielectric insulation layer includes a first material having a thermal conductivity of between 25 and 180 W/mK, and an insulation strength of between 15 and 50 kV/mm, and an electrically conducting or semiconducting second material evenly distributed within the first material.

17 Claims, 3 Drawing Sheets

SEMICONDUCTOR SUBSTRATE

TECHNICAL FIELD

The instant disclosure relates to a semiconductor substrate, in particular to a semiconductor substrate for power semiconductor modules.

BACKGROUND

Power semiconductor module arrangements often include a base plate within a housing. At least one substrate is arranged on the base plate. A semiconductor arrangement including a plurality of controllable semiconductor components (e.g., two IGBTs in a half-bridge configuration) is usually arranged on at least one of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor components are mounted, for example, on the first metallization layer. The first metallization layer may be a structured layer while the second metallization layer is usually a continuous layer. The second metallization layer is usually attached to the base plate.

Heat that is generated by the controllable semiconductor components is dissipated through the substrate to the base plate or to a heat sink. As the first metallization layer usually is a structured layer, the distribution of the electrical fields occurring in the substrate during the use of the semiconductor arrangement is not homogenous and may result in local spikes. In areas of high field strength, partial discharging effects may occur. These partial discharging effects may result in a degradation of the substrate layer which may reduce the lifetime of the power semiconductor module arrangement.

There is a need for an improved semiconductor substrate which has a good thermal conductivity and an increased resistance against partial discharging effects.

SUMMARY

A semiconductor substrate includes a dielectric insulation layer, and a first metallization layer attached to the dielectric insulation layer. The dielectric insulation layer comprises a first material having a thermal conductivity of between 25 and 180 W/mK, and an insulation strength of between 15 and 50 kV/mm, and an electrically conducting or semiconducting second material, wherein the second material is evenly distributed within the first material.

The invention may be better understood with reference to the following drawings and the description. The components in the figures are not necessarily to scale, emphasis is instead being placed upon illustrating the principles of the invention. Moreover, in the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
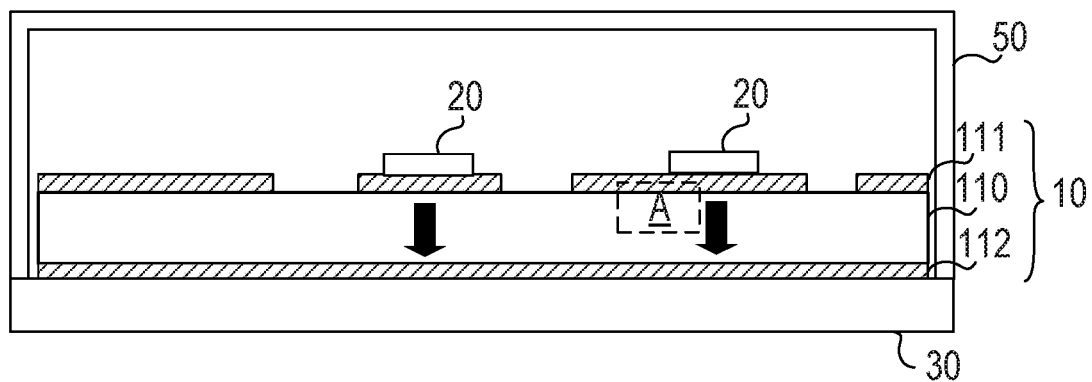
FIG. 1 illustrates a cross-sectional view of a semiconductor substrate arrangement.

FIG. 1 exemplarily illustrates a power semiconductor module arrangement comprising a semiconductor substrate 10. The semiconductor substrate 10 includes a dielectric insulation layer 110, a structured first metallization layer 111 attached to the dielectric insulation layer 110, and a second metallization layer 112 attached to the dielectric insulation layer 110. The dielectric insulation layer 110 is disposed between the first and second metallization layers 111, 112. The power semiconductor module arrangement may further comprise a housing 50, wherein the housing 50 may comprise sidewalls and a cover.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 is a ceramic substrate, that is, a substrate in which the dielectric insulation layer 110 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 110 may consist of or include one of the following materials: $Al_2O_3$, AlN, or $Si_3N_4$. For instance, the substrate may, e.g., be a Direct Copper Bonding (DCB) substrate, a Direct Aluminium Bonding (DAB) substrate, or an Active Metal Brazing (AMB) substrate. The dielectric insulation layer 110 generally comprises a high insulation resistance while, at the same time, having a low thermal conduction coefficient.

Usually one or more semiconductor bodies 20 are arranged on a semiconductor substrate 10. Each of the semiconductor bodies 20 arranged on a semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element. One or more semiconductor bodies 20 may form a semiconductor arrangement on the semiconductor substrate. In FIG. 1, two semiconductor bodies 20 are exemplarily illustrated. Any other number of semiconductor bodies 20, however, is also possible.

The semiconductor substrate 10 may be attached to a base plate or heat sink 30 with the second metallization layer 112 arranged between the dielectric insulation layer 110 and the base plate/heat sink 30. This, however, is only an example. Other semiconductor module arrangements are known, wherein the semiconductor substrate 10 comprises only a first metallization layer 111, and wherein the second metallization layer 112 is omitted. In such power semiconductor module arrangements, the dielectric insulation layer 110 may form the base plate and may be attached to a heat sink 30 without a second metallization layer 112 arranged between the dielectric insulation layer 110 and the heat sink 30. Heat that is generated by the semiconductor bodies 20 may be dissipated through the semiconductor substrate 10 to the base plate or heat sink 30. This is exemplarily illustrated by the bold arrows in FIG. 1. The second metallization layer 112 of the semiconductor substrate 10 in FIG. 1 is a continuous layer. The first metallization layer 111 of the semiconductor substrate 10 in FIG. 1 is a structured layer in the arrangement illustrated in FIG. 1. "Structured layer" means that the first metallization layer 111 is not a continuous layer, but includes recesses between different sections of the layer. Such recesses are schematically illustrated in FIG. 1. The first metallization layer 111 in this arrangement exemplarily includes four different sections. Different semiconductor bodies 20 may be mounted to the same or to different sections of the first metallization layer 111. Different sections of the first metallization layer 111 may have no electrical connection or may be electrically connected to one or more other sections using electrical connections such as, e.g., bonding wires. Electrical connections may also include connection plates or conductor rails, for example, to name just a few examples. The first metallization layer 111 being a structured layer, however, is only an example. It is also possible that the first metallization layer 111 is a continuous layer.

Figure 2:
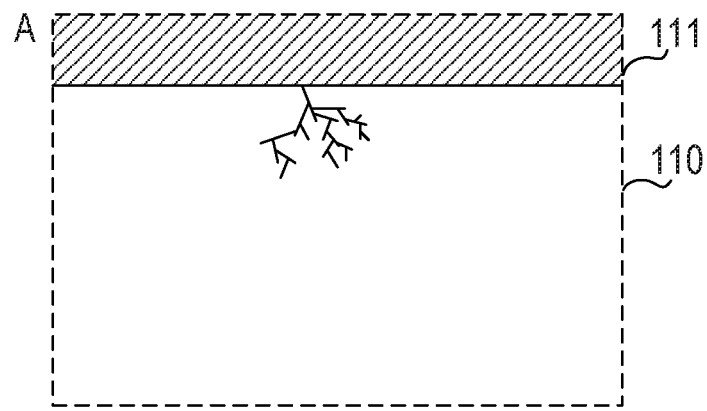
FIG. 2 schematically illustrates a cross-sectional view of a section of the semiconductor substrate arrangement of FIG. 1.

During the use of the power semiconductor module arrangement, electrical fields are generated within the arrangement. Such electrical fields may be inhomogeneously distributed within the dielectric insulation layer 110. Typical voltages during the use of a semiconductor arrangement range up to 6500V AC RMS (root mean square), for example, resulting in electric field strengths within the dielectric insulation layer 110 of up to 60 kV/mm and even more, especially in areas adjacent to the (structured) first metallization layer 111 (adjacent to the junction between the first metallization layer 111 and the dielectric insulation layer 110). Due to the high electric field strengths, the insulation strength of the dielectric insulation layer 110 may be exceeded, resulting in partial discharging effects in some parts of the dielectric insulation layer 110. Partial discharging effects usually are slow-growing degradations of the ceramic material, typically close to the surface in areas where a junction is formed between the first metallization layer 111 and the dielectric insulation layer 110. This is schematically illustrated in FIG. 2, which exemplarily illustrates a section A of the semiconductor substrate 10 of FIG. 1. As can be seen in FIG. 2, the degradations usually extend tree-like into the dielectric insulation layer 110, thereby weakening the dielectric insulation layer 110.

Degradations caused by partial discharging effects are linked to several physical principles. On the one hand, they depend on the electric field strength, as already mentioned before. On the other hand, they depend on the average free length of path within the dielectric insulation layer 110, which is the distance over which a charged particle is able to accelerate in an electric field. Cavities within a dielectrically insulating material may function as reproduction centers for partial discharging, because they may allow the average free length to become great enough to move further free charge carriers to higher energy levels which again may cause further free charge carriers to move to higher energy levels. In this way, avalanche effects may occur.

Figure 3:
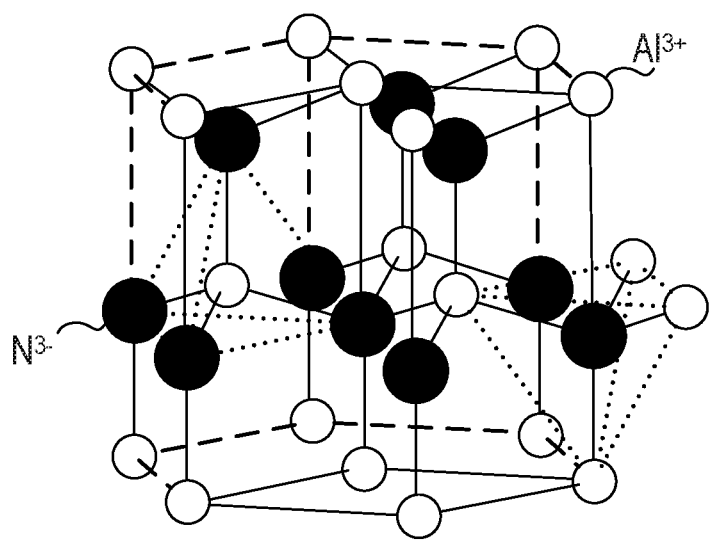
FIG. 3 schematically illustrates the crystal structure of aluminum nitride.

As has been described before, the dielectric insulation layer 110 may comprise aluminum nitride (AlN), for example. The crystal structure of AlN is exemplarily illustrated in FIG. 3. The aluminum $Al^{3+}$ and nitride $N^{3-}$ atoms are evenly distributed within the crystal lattice. The ceramic crystals have a generally triangular or needle-shaped structure, as is indicated by the dotted lines in FIG. 3. The crystals of other ceramic materials may have similar structures. Such crystal structures may facilitate the formation of cavities within the dielectric insulation layer 110 which may lead to the disadvantages outlined above.

Figure 4:
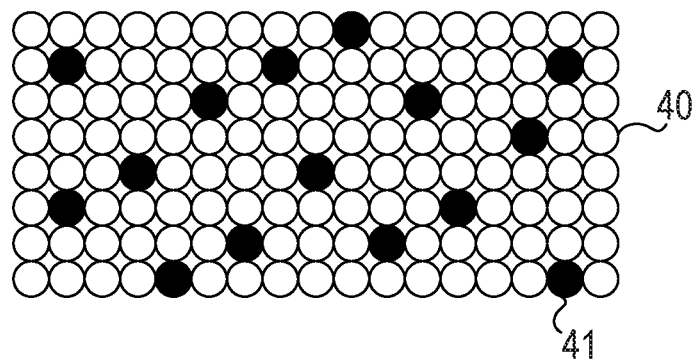
FIG. 4 schematically illustrates the structure of a semiconductor substrate according to one example.
Figure 7:
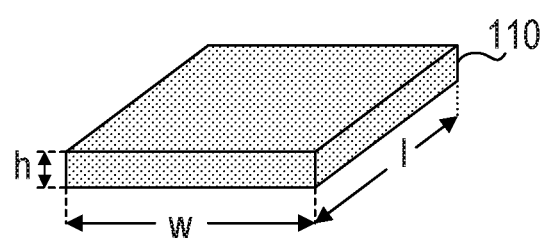
FIG. 7 schematically illustrates a dielectric insulation layer.

As is schematically illustrated in FIG. 4, the dielectric insulation layer 110, according to one example, includes a first material 40 and a second material 41. The first material 40 has a thermal conductivity of between 25-180 W/mK and an insulation strength of between 15 and 50 kV/mm. The first material 40, e.g., may be a ceramic material, as has been described above. For example, the first material 40 may comprise one of $Al_2O_3$, AlN, and $Si_3N_4$. Any other suitable materials having a thermal conductivity of between 25-180 W/mK and an insulation strength of between 15 and 50 kV/mm, however, are also possible. The second material 41 may be added to the first material 40 and may be evenly distributed within the first material 40. Now referring to FIG. 7, the dielectric insulation layer 110 comprises a first length l, a first width w and a first height h. The first height h corresponds to a distance between the first metallization layer 111 and the second metallization layer 112 (metallization layers 111, 112 not illustrated in FIG. 7). The dielectric insulation layer 110, therefore, forms a first volume V=l*w*h. The second material 41 may be evenly distributed within the entire volume V.

The second material 41 is an electrically conducting or semiconducting material. Generally speaking, the first material 40 has a first specific resistance and the second material 41 has a second specific resistance, wherein the second specific resistance is less than the first specific resistance. Adding a certain amount of the second material 41 to the first material 40, therefore, reduces the electrical resistance of the dielectric insulation layer 110 to a certain degree and increases the electrical conductivity of the dielectric insulation layer 110 as compared to a dielectric insulation layer 110 which is formed only by the first material 40. The amount of second material 41, therefore, should be chosen such that an adequate insulation capacity of the dielectric insulation layer 110 is still maintained. Adding a small amount of second material 41 usually does not lead to a significant reduction of the insulating properties of the dielectric insulation layer 110.

The amount of second material 41 that is added to the first material 40 may depend on the type of the first material 40. For example, the amount of second material 41 that can be added to AlN may be significantly lower than the amount of second material 41 that can be added to $Si_3N_4$. The amount of first material 40 in any case may be greater than the amount of second material 41. The ratio between the amount of first material 40 and the amount of second material 41 may be less than 9:1, for example. A dielectric insulation layer 110 comprising more than 10% of the second material 41 may not provide sufficient insulation strength. The amount of second material 41 may depend on the type of first material 40 that is used for the dielectric insulation layer 110. For some types of first material 40, the maximum amount of second material 41 may only be about 5%. For most applications, the amount of second material 41 within the dielectric insulation layer 110 may be between 5% and 10%. The second material 41 may comprise particles that are evenly distributed within the crystal lattice of the first material 40. The amount of second material 41 within the first material 40 may be sufficiently low such that no conductive paths are formed by a plurality of adjacent particles of the second material 41.

In FIG. 4, the particles of the first and second material 40, 41 are schematically illustrated in round shapes for convenience only. FIG. 4 solely serves to illustrate in a very simple way the distribution of the second material 41 within the first material 40. Some particles of the second material 41 may be arranged adjacent to one of the surfaces of the dielectric insulation layer 110. Other particles may be surrounded by particles of the first material 40. The second material 41 may comprise particles with a particle size of less than 100 μm or less than 1 μm, for example. The particle size may depend on the impact of the second material 41 on the mechanical properties of the dielectric insulation layer 110. For example, the breaking strength of the dielectric insulation layer 110 could be reduced if the particle size of the second material 41 is too large. This, however, depends on the first material 40 that is used to form the dielectric insulation layer 110.

Figure 5:
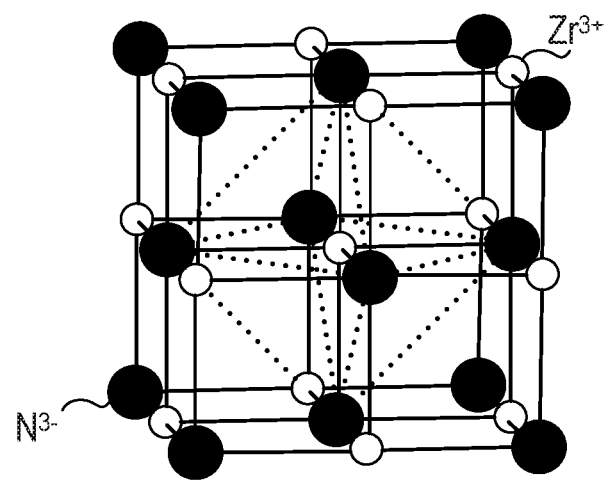
FIG. 5 schematically illustrates the crystal structure of zirconium nitride.

The second material 41 may comprise at least one of ZrN, $ZrO_2$, and graphite, for example. These materials, however, are only examples. Any other suitable electrically conducting or semiconducting materials may be used which are compatible to the first material 40. Compatible in this context means that the particles of the second material 41 may be inserted in the crystal structure of the first material 40. The structure of ZrN is exemplarily illustrated in FIG. 5. As is indicated in dotted lines in FIG. 5, the ZrN structure has the shape of an octahedron. By adding this material of different shape to the triangular shape of the ceramic material, the formation of cavities can be reduced. Further, if high field strengths occur in the vicinity of a particle of the second material 41, this selective field strain may be spread by the particle over a greater area with a lower electrical resistance which may reduce the degradation of the ceramic material of the dielectric insulation layer 110 due to permanent selective electric field strain.

As can be seen from what has been described above, the second material 41 forms capturing centers within the first material 40 which reduce the average free length of path for free charge carriers within the dielectric insulation layer 110. Thereby, avalanche effects can be reduced or even prevented. The electric field is more evenly distributed within the dielectric insulation layer 110.

According to one example, the first material 40 is silicone nitride $Si_2N_4$, and the second material is zirconium nitride ZrN. Silicone nitride generally has a very high breaking strength. However, silicone nitride is usually not suitable for high voltage applications which require voltages of more than 3300V AC RMS, because it is vulnerable to partial discharging effects. At high field strengths, silicone nitride tends to completely lose its insulating properties. For example, a dielectric insulation layer 110 formed of silicone nitride, having a height h of 1 mm may lose its insulating properties at voltages of about 8 to 10 kV AC RMS. Adding, e.g., zirconium nitride to the silicone nitride, increases the electrical stability of the dielectric insulation layer 110. A dielectric insulation layer 110 comprising silicone nitride and a certain amount of zirconium nitride may be used for higher voltages as compared to a dielectric insulation layer 110 which solely comprises silicone nitride. For example, voltages of 3300V AC RMS or more are possible for a layer including silicone nitride and a certain amount of zirconium nitride. A pure silicone nitride substrate is usually used at voltages of 1700V AC RMS or less.

According to another example, the first material 40 is $Al_2O_3$ and the second material 41 is $ZrO_2$. According to an even further example, the first material 40 is AlN and the second material 41 is ZrN.

Figure 6:
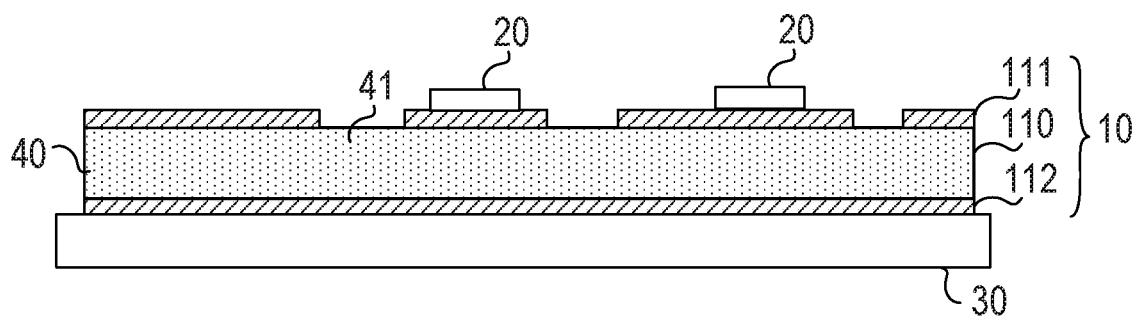
FIG. 6 schematically illustrates a cross-sectional view of a semiconductor substrate arrangement with a semiconductor substrate according to one example.
Figure 8:
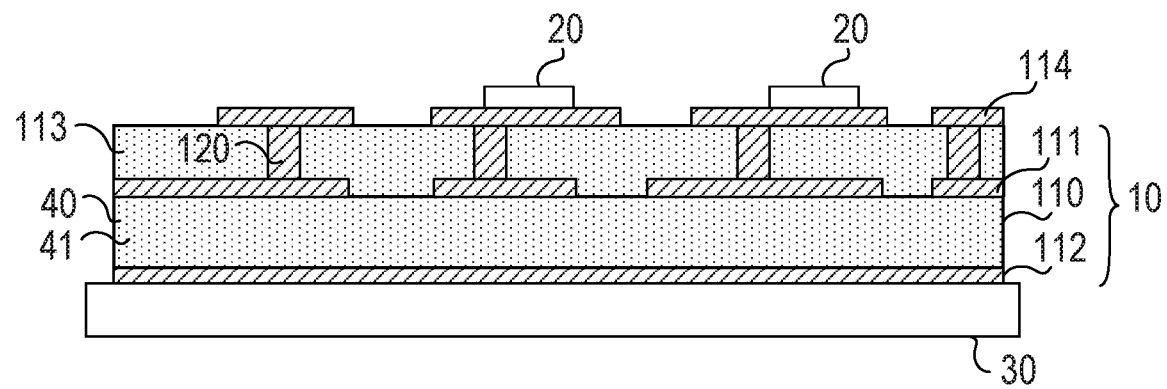
FIG. 8 schematically illustrates a cross-sectional view of a multilayer semiconductor substrate.

FIG. 6 exemplarily illustrates a power semiconductor module arrangement comprising a semiconductor substrate 10, as has been described above with respect to FIGS. 3 to 5. The arrangement is generally similar to the arrangement of FIG. 1. The semiconductor substrate 10 in the example of FIG. 10, however, comprises the first material 40 and the second material 41, as has been described above. Dielectric insulation layers 110 comprising a first material 40 and a second material 41 may also be used in multi-layer substrates, as is schematically illustrated in FIG. 8. The multi-layer substrate that is exemplarily illustrated in FIG. 8 further comprises a second dielectric insulation layer 113. The first metallization layer 111 is arranged between the first dielectric insulation layer 110 and the second dielectric insulation layer 113. A third metallization layer 114 is formed on a top surface of the second dielectric insulation layer 113. The first metallization layer 111 and the third metallization layer 114 are connected by means of vias 120 which extend through the second dielectric insulation layer 113. The semiconductor bodies 20 are arranged on the third metallization layer 114. The first and the second dielectric insulation layers 110, 113 may both comprise a first material 40 and a second material 41 that is evenly distributed within the first material 40, as has been described with reference to FIGS. 4 to 7 above.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A power semiconductor module arrangement comprising a semiconductor substrate, the semiconductor substrate comprising:

a dielectric insulation layer; and
a first metallization layer attached to the dielectric insulation layer;
a second dielectric insulation layer;
a third metallization layer; and
at least one semiconductor body mounted to the third metallization layer,
wherein the dielectric insulation layer comprises a first material having a thermal conductivity of between 25 and 180 W/mK, and an insulation strength of between 15 and 50 kV/mm, and an electrically conducting or semiconducting second material,
wherein the second material is evenly distributed within the first material,
wherein the first metallization layer is arranged between the dielectric insulation layer and the second dielectric insulation layer,
wherein the second dielectric insulation layer is arranged between the first metallization layer and the third metallization layer,
wherein the second dielectric insulation layer comprises the first material and the second material, and
wherein the second material is evenly distributed within the first material.

2. The power semiconductor module arrangement of claim 1, wherein the dielectric insulation layer has a first amount of the first material and a second amount of the second material, and wherein the first amount is greater than the second amount.

3. The power semiconductor module arrangement of claim 2, wherein the amount of second material in the dielectric insulation layer is less than 10%.

4. The power semiconductor module arrangement of claim 2, wherein the amount of second material in the dielectric insulation layer is between 5% and 10%.

5. The power semiconductor module arrangement of claim 1, wherein the first material comprises one of $Al_2O_3$, AlN, and $Si_3N_4$.

6. The power semiconductor module arrangement of claim 1, wherein the second material comprises at least one of ZrN, $ZrO_2$ and graphite.

7. The power semiconductor module arrangement of claim 1, wherein the first material comprises one of $Al_2O_3$, AlN, and $Si_3N_4$, and wherein the second material comprises at least one of ZrN, $ZrO_2$ and graphite.

8. The power semiconductor module arrangement of claim 1, wherein the second material comprises particles with a particle size of less than 100 μm.

9. The power semiconductor module arrangement of claim 1, wherein the second material comprises particles with a particle size of less than 1 μm.

10. The power semiconductor module arrangement of claim 1, wherein the dielectric insulation layer comprises a first length, a first width, a first height, and a first volume, wherein the first height corresponds to a distance between the first metallization layer and a second metallization layer, and wherein the second material is evenly distributed throughout the first volume.

11. The power semiconductor module arrangement of claim 1, wherein the first material has a first specific resistance and the second material has a second specific resistance, and wherein the second specific resistance is less than the first specific resistance.

12. The power semiconductor module arrangement of claim 1, wherein the first metallization layer is a structured metallization layer that only partly covers a first surface of the dielectric insulation layer.

13. The power semiconductor module arrangement of claim 1, wherein the semiconductor substrate further comprises a second metallization layer attached to the dielectric insulation layer, and wherein the dielectric insulation layer is disposed between the first and second metallization layers.

14. The power semiconductor module arrangement of claim 13, wherein the second metallization layer is configured to be attached to a base plate or a heat sink.

15. The power semiconductor module arrangement of claim 1, further comprising a housing.

16. The power semiconductor module arrangement of claim 1, further comprising a base plate.

17. The power semiconductor module arrangement of claim 1, further comprising a heat sink.

* * * * *